United States Patent
Henry et al.

(10) Patent No.: US 10,019,260 B2
(45) Date of Patent: Jul. 10, 2018

(54) FINGERPRINT UNITS COMPARING STORED STATIC FINGERPRINTS WITH DYNAMICALLY GENERATED FINGERPRINTS AND RECONFIGURING PROCESSOR SETTINGS UPON A FINGERPRINT MATCH

(71) Applicant: VIA ALLIANCE SEMICONDUCTOR CO., LTD, Shanghai (CN)

(72) Inventors: G. Glenn Henry, Austin, TX (US); Rodney E. Hooker, Austin, TX (US); Colin Eddy, Austin, TX (US); Terry Parks, Austin, TX (US)

(73) Assignee: VIA ALLIANCE SEMICONDUCTOR CO., LTD, Shanghai (CN)

( * ) Notice: Subject to any disclaimer, the term of this patent is extended or adjusted under 35 U.S.C. 154(b) by 871 days.

(21) Appl. No.: 14/050,687

(22) Filed: Oct. 10, 2013

(65) Prior Publication Data
US 2015/0089204 A1     Mar. 26, 2015

Related U.S. Application Data

(60) Provisional application No. 61/880,620, filed on Sep. 20, 2013.

(51) Int. Cl.
*G06F 15/78* (2006.01)
*G06F 9/30* (2018.01)
(Continued)

(52) U.S. Cl.
CPC ............ *G06F 9/3001* (2013.01); *G06F 8/654* (2018.02); *G06F 9/30181* (2013.01); *G06F 15/7892* (2013.01); *G06F 17/5054* (2013.01)

(58) Field of Classification Search
CPC . G06F 15/7867; G06F 9/3001; G06F 15/7871
See application file for complete search history.

(56) References Cited

U.S. PATENT DOCUMENTS 4,968,907 A * 11/1990 Pepper ................... H03K 5/131
                                                    327/141
5,671,442 A    9/1997 Feeney et al.
(Continued)

FOREIGN PATENT DOCUMENTS

GB    2515573 A * 12/2014 ......... G06F 15/7867
TW    I344109        2/2009
(Continued)

OTHER PUBLICATIONS

Reinman, Glenn et al. "Using a Serial Cache for Energy Efficient Instruction Fetching." May 10, 2004. Retrieved from the internet: http://www.sciencedirect.com/science/article/pii/S138376210400030X. Retrieved on Jul. 10, 2014 pp. 1-21.
(Continued)

*Primary Examiner* — Jacob A Petranek
(74) *Attorney, Agent, or Firm* — McClure, Qualey & Rodack, LLP

(57) ABSTRACT

A microprocessor includes a plurality of dynamically reconfigurable functional units, a fingerprint, and a fingerprint unit. As the plurality of dynamically reconfigurable functional units execute instructions according to a first configuration setting, the fingerprint unit accumulates information about the instructions according to a mathematical operation to generate a result. The microprocessor also includes a reconfiguration unit that reconfigures the plurality of dynamically reconfigurable functional units to execute instructions according to a second configuration setting in response to an indication that the result matches the fingerprint.

29 Claims, 9 Drawing Sheets

(51) Int. Cl.
*G06F 8/654* (2018.01)
*G06F 17/50* (2006.01)

(56) References Cited

U.S. PATENT DOCUMENTS

| | | | |
|---|---|---|---|
| 5,958,044 | A | 9/1999 | Brown et al. |
| 6,079,008 | A | 6/2000 | Clery, III |
| 6,167,479 | A | 12/2000 | Hartnett et al. |
| 6,182,206 | B1* | 1/2001 | Baxter .................. G06F 8/447 712/227 |
| 6,240,468 | B1 | 5/2001 | Capelli |
| 6,289,396 | B1 | 9/2001 | Keller et al. |
| 6,321,302 | B1* | 11/2001 | Strongin ................ G06F 9/383 710/52 |
| 6,370,638 | B1 | 4/2002 | Yamasaki |
| 6,438,557 | B1 | 8/2002 | Dent |
| 6,438,664 | B1* | 8/2002 | McGrath .................. G06F 9/24 711/102 |
| 6,678,707 | B1* | 1/2004 | Butler .................. G06F 7/588 708/250 |
| 6,681,357 | B2* | 1/2004 | Pendurkar ........ G11C 29/56004 714/732 |
| 6,732,263 | B1 | 5/2004 | May et al. |
| 6,948,050 | B1 | 9/2005 | Gove et al. |
| 6,957,437 | B1 | 10/2005 | Bogia et al. |
| 7,111,154 | B2 | 9/2006 | Rupley et al. |
| 7,185,171 | B2 | 2/2007 | Fukuoka et al. |
| 7,194,610 | B2 | 3/2007 | Uriu et al. |
| 7,310,741 | B2 | 12/2007 | Huemiller, Jr. |
| 7,366,891 | B2 | 4/2008 | Khanna et al. |
| 7,418,582 | B1 | 8/2008 | Iacobovici et al. |
| 7,478,388 | B1 | 1/2009 | Chen et al. |
| 7,516,334 | B2* | 4/2009 | Suzuoki .................. G06F 1/206 713/300 |
| 7,552,316 | B2 | 6/2009 | Hussain |
| 7,558,723 | B2 | 7/2009 | Traut |
| 7,774,531 | B1 | 8/2010 | Karlsson |
| 8,769,245 | B2 | 7/2014 | Hsieh et al. |
| 8,782,293 | B1 | 7/2014 | Diewald et al. |
| 8,782,435 | B1* | 7/2014 | Ghose .................. G06F 9/3851 711/118 |
| 8,984,296 | B1* | 3/2015 | Young .................. G06F 9/4411 713/176 |
| 2001/0004760 | A1* | 6/2001 | Im .................. G01R 31/31724 714/732 |
| 2003/0093686 | A1 | 5/2003 | Barnes et al. |
| 2003/0126358 | A1* | 7/2003 | Litt .................. G06F 9/381 711/108 |
| 2004/0059892 | A1 | 3/2004 | Paolucci |
| 2004/0177269 | A1 | 9/2004 | Belnet et al. |
| 2005/0138449 | A1 | 6/2005 | Katoh et al. |
| 2005/0210454 | A1 | 9/2005 | DeWitt, Jr. et al. |
| 2005/0240850 | A1* | 10/2005 | Ohwada ......... G01R 31/318547 714/738 |
| 2006/0015855 | A1 | 1/2006 | Kumamoto |
| 2006/0020860 | A1* | 1/2006 | Tardif ............ G01R 31/318566 714/724 |
| 2006/0168590 | A1 | 7/2006 | Khanna et al. |
| 2006/0212609 | A1 | 9/2006 | Zimmer et al. |
| 2006/0253689 | A1 | 11/2006 | Knowles |
| 2006/0282732 | A1* | 12/2006 | Kiryu ............ G01R 31/318547 714/738 |
| 2007/0043531 | A1 | 2/2007 | Kosche et al. |
| 2007/0143577 | A1 | 6/2007 | Smith |
| 2007/0226795 | A1 | 9/2007 | Conti et al. |
| 2008/0104363 | A1 | 5/2008 | Raj et al. |
| 2008/0162886 | A1 | 7/2008 | Saha et al. |
| 2008/0163212 | A1 | 7/2008 | Zimmer et al. |
| 2009/0013414 | A1* | 1/2009 | Washington ............ G06F 21/10 726/32 |
| 2009/0037916 | A1 | 2/2009 | Morishita et al. |
| 2009/0164812 | A1 | 6/2009 | Capps, Jr. et al. |
| 2010/0011198 | A1 | 1/2010 | Hooker et al. |
| 2010/0037033 | A1 | 2/2010 | Karecha et al. |
| 2010/0205674 | A1 | 8/2010 | Zorn et al. |
| 2010/0281134 | A1* | 11/2010 | Melen .................. G06F 11/0739 709/217 |
| 2010/0319001 | A1 | 12/2010 | Jones |
| 2011/0238920 | A1 | 9/2011 | Hooker et al. |
| 2011/0264893 | A1 | 10/2011 | Endo et al. |
| 2012/0151192 | A1 | 6/2012 | Hsieh et al. |
| 2012/0226868 | A1* | 9/2012 | Ceze .................. G06F 9/522 711/125 |
| 2013/0159683 | A1* | 6/2013 | Hickey .............. G06F 9/30072 712/223 |
| 2013/0290683 | A1 | 10/2013 | Brown et al. |
| 2013/0311754 | A1 | 11/2013 | Brown et al. |
| 2013/0311755 | A1 | 11/2013 | Henry et al. |

FOREIGN PATENT DOCUMENTS

| | | |
|---|---|---|
| TW | I320636 | 2/2010 |
| TW | 201106262 | 2/2011 |
| TW | I398856 | 3/2011 |
| TW | 201234271 | 8/2012 |
| WO | WO2002073336 | 9/2002 |
| WO | WO2006117562 | 11/2006 |

OTHER PUBLICATIONS

Tarjan, David et al. "Federation: Repurposing Scalar Cores for Out-of-Order Instruction Issue." Jun. 8, 2008. Retrieved from the internet: http://www.cs.virginia.edu/~skadron/papers/federation_dac08.pdf. Retrieved on Jul. 9, 2014. pp. 1-4.

"Buffer Overflow" Wikipedia, the free encyclopedia. Downloaded on Sep. 5, 2013 from http://en.wikipedia.org/wiki/Buffer_overflow. pp. 1-12.

Prabhu, Pratap et al. "Smashing the Stack with Hydra." Downloaded on Sep. 5, 2013 from http://www.cs.columbia.edu/~yingbo/publications/defcon09hydra.pdf. pp. 1-22.

Shmatikov, Vitaly. "Buffer Overflow and Other Memory Corruption Attacks." Downloaded on Sep. 17, 2013 from http://www.cs.utexas.edu/~shmat/courses/cs378/memattacks.pdf. pp. 1-85.

"NOP slide" Wikipedia, the free encyclopedia. Downloaded on Sep. 17, 2013 from http://en.wikipedia.org/wiki/NOP_sled. pp. 1-2.

CLET Team. "Polymorphic Shellcode Engine." PHRACK Magazine. Downloaded Sep. 16, 2013 from http://www.phrack.org/issues.html?issue=61&id=9. pp. 1-24.

Solar Eclipse. "Honeynet Project Scan of the Month for Apr. 2002." Scan 20 by Solar Eclipse. Downloaded Sep. 5, 2013 from http://web.archive.org/web/20110724121400/http://www.phreedom.org/solar/honeynet/scan20/scan20.html. pp. 1-4.

* cited by examiner

FINGERPRINT UNITS COMPARING STORED STATIC FINGERPRINTS WITH DYNAMICALLY GENERATED FINGERPRINTS AND RECONFIGURING PROCESSOR SETTINGS UPON A FINGERPRINT MATCH

CROSS REFERENCE TO RELATED APPLICATION(S)

This application claims priority based on U.S. Provisional Application, Ser. No. 61/880,620, filed Sep. 20, 2013, entitled DYNAMICALLY RECONFIGURABLE MICROPROCESSOR; MICROPROCESSOR WITH INTEGRATED NOP SLIDE DETECTOR, which is hereby incorporated by reference in its entirety.

BACKGROUND

Microprocessor designers spend much effort on performance analysis. After architecting a microprocessor with a base set of features and performance targets based on previous generations of microprocessors, they execute a representative sample of the software applications that matter most to their customers and capture instruction execution traces of the software applications. They then use the captured traces as stimulus to simulate the operation of the microprocessor being designed. They may configure different characteristics of the simulated microprocessor in an effort to achieve the highest aggregate performance across all of the target software applications. Often, a particular configuration of characteristics is desirable for one target application and undesirable for another. In these cases, the designers make a decision as to which software application is more important, or find another approach that attempts to balance the needs of the multiple software applications. The choice often does not achieve the optimal performance of the target software applications since it may attempt to optimize the performance of one software application at the expense of another software application.

Once the best average set of configuration settings has been identified, the microprocessor designers code them into the design with VHDL or Verilog code, for example. Other microprocessors improve on the hardcoded configuration by including a bank of fuses in the microprocessor that may be selectively blown during manufacturing of the microprocessor to alter the configuration settings from their hardcoded values. This allows the microprocessor a limited degree of optimization in manufacturing, perhaps in response to new software applications or operating systems introduced after the microprocessor was designed. However, this solution still does not achieve the optimal performance of the target software applications in that it requires the designer/manufacturer to choose a configuration optimized for some applications at the expense of other applications, or to choose a balanced configuration that is likely not optimized for any applications.

To address this problem, U.S. patent application Ser. No. 12/170,591, filed Jul. 10, 2008, which is hereby incorporated by reference in its entirety for all purposes, and which is assigned to the same person to which the present application is subject to an obligation of assignment, describes a microprocessor that may be dynamically configured into multiple operating modes by a device driver based on the currently running applications. However, a need for even greater performance optimization is realized.

BRIEF SUMMARY

In one aspect the present invention provides a microprocessor. The microprocessor includes a plurality of dynamically reconfigurable functional units, a fingerprint, and a fingerprint unit. As the plurality of dynamically reconfigurable functional units execute instructions according to a first configuration setting, the fingerprint unit accumulates information about the instructions according to a mathematical operation to generate a result. The microprocessor also includes a reconfiguration unit that reconfigures the plurality of dynamically reconfigurable functional units to execute instructions according to a second configuration setting in response to an indication that the result matches the fingerprint.

In another aspect, the present invention provides a method performed by a microprocessor having a fingerprint and a plurality of dynamically reconfigurable functional units. The method includes, as the plurality of dynamically reconfigurable functional units execute instructions according to a first configuration setting, accumulating information about the instructions according to a mathematical operation to generate a result. The method also includes reconfiguring the plurality of dynamically reconfigurable functional units to execute instructions according to a second configuration setting in response to an indication that the result matches a fingerprint.

In yet another aspect, the present invention provides a microprocessor. The microprocessor includes a plurality of dynamically reconfigurable functional units, a static count, and an instruction counter. As the plurality of dynamically reconfigurable functional units execute instructions according to a first configuration setting, the instruction counter counts the instructions according to a criteria to generate a dynamic count. The microprocessor also includes a reconfiguration unit that reconfigures the plurality of dynamically reconfigurable functional units to execute instructions according to a second configuration setting in response to an indication that the dynamic count matches the static count.

In yet another aspect, the present invention provides a method performed by a microprocessor having a static count and a plurality of dynamically reconfigurable functional units. The method includes, as the plurality of dynamically reconfigurable functional units execute instructions according to a first configuration setting, counting the instructions according to a criteria to generate a dynamic count. The method also includes reconfiguring the plurality of dynamically reconfigurable functional units to execute instructions according to a second configuration setting in response to an indication that the dynamic count matches the static count.

DETAILED DESCRIPTION OF THE EMBODIMENTS

Glossary

Figure 1:
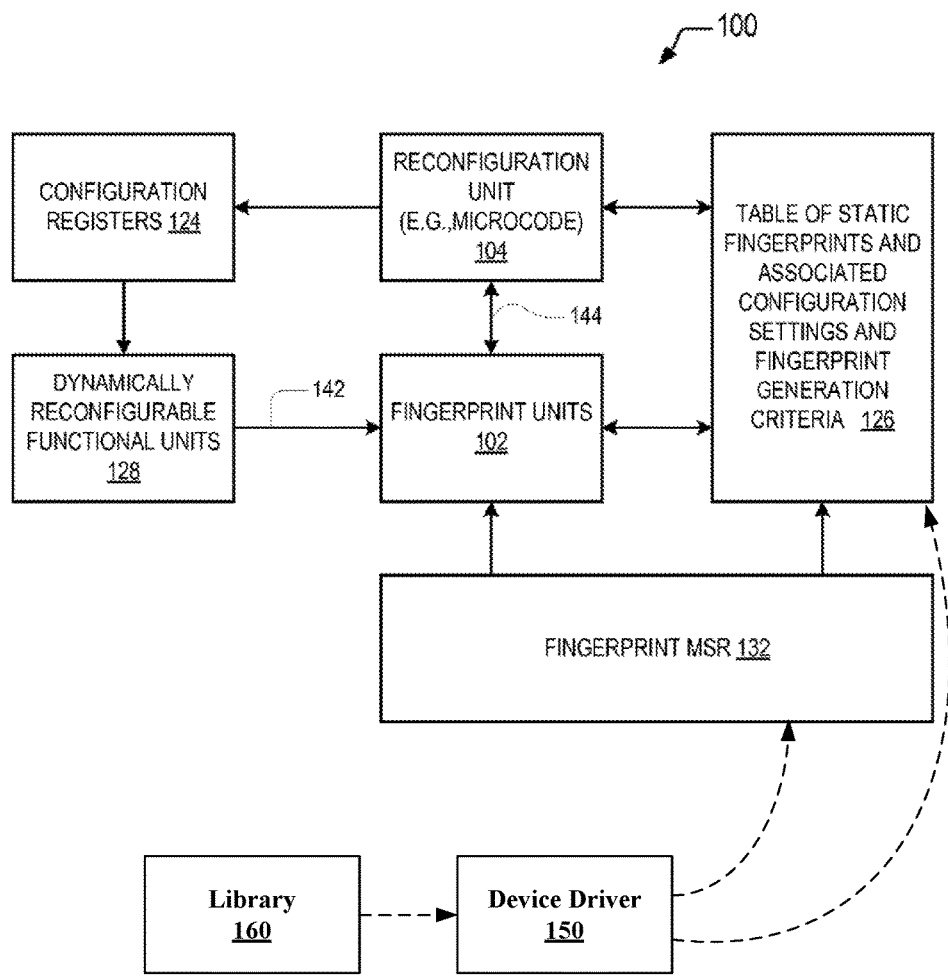
FIG. 1 is a block diagram illustrating a microprocessor.

A fingerprint is a value that identifies a sequence of instructions of a program. The value is generated as the result of the accumulation of information about the instructions of the sequence according to a mathematical operation. The information may include, for example, various combinations of the instruction pointer value of the instruction (i.e., the address of the instruction), the opcode of the instruction, a displacement of the instruction, a prefix of the instruction, and/or an addressing mode portion of the instruction, such as the SIB or modRM bytes of an x86 architecture instruction or portions thereof. The mathematical operation by which the instruction information is accumulated may include, for example, continuously computing a cyclic redundancy code (CRC) of the information associated with each instruction in the sequence. The mathematical operation may include, for another example, accumulating the instruction information in a multiple input shift register (MISR) using a maximum count polynomial. The mathematical operation may include, for another example, accumulating the instruction information according to a hash function, such as a variable-length data hash function. The mathematical operation may include, for another example, accumulating the instruction information by concatenating the instruction information in a queue, such as a fixed-length queue.

Fingerprints are of two types, static and dynamic, based on the two different points in time in which they are generated. A fingerprint unit of a microprocessor generates a dynamic fingerprint as the microprocessor executes instructions of a program, whereas an engineer generates a static fingerprint beforehand. A static fingerprint is provided to the fingerprint unit so that it can compare the dynamic fingerprint it generates with the static fingerprint it receives. The fingerprint unit may also receive fingerprint generation criteria, such as start conditions, stop conditions and reset conditions that control when the fingerprint unit accumulates the instruction information to generate the dynamic fingerprint. The fingerprint generation criteria may also specify the combination of the portions of the instruction information the fingerprint unit will accumulate to generate the dynamic fingerprint.

As each instruction is executed (preferably fetched), the fingerprint unit receives the instruction information. If the fingerprint unit detects a start condition, it begins accumulating the instruction information according to the mathematical operation to generate a result, which is the dynamic fingerprint. The fingerprint unit continues to receive instruction information as each instruction is executed and continues to accumulate the instruction information according to the mathematical operation to generate a result until the fingerprint unit detects a stop condition or a reset condition. In the case of a reset condition, the fingerprint unit clears the state of the accumulation and again begins accumulating the instruction information according to the mathematical operation to generate a result. Preferably, each time the fingerprint unit generates a new result between a start condition and a stop condition, it compares the result (dynamic fingerprint) to the static fingerprint and indicates a match if they are the same. Examples of start conditions include a taken branch instruction, a return instruction, a return from interrupt instruction, a trap condition, an exception condition, a system call or return instruction (such as an x86 SYSENTER or SYSEXIT instruction), a subroutine call instruction, a functional unit control instruction (such as an x86 FINIT instruction), or an indication from another fingerprint unit that it has detected a fingerprint match. Examples of stop conditions include conditions similar to the start conditions and may also include a fingerprint match and the expiration of a count of instructions executed after a start condition. Examples of reset conditions include conditions similar to the start conditions and may also include a hard reset and an instruction that is not a no operation (NOP) instruction.

The generation of static fingerprints is as follows. An engineer identifies a target set of program portions for which it is desirable to increase performance, reduce power consumption and/or fix a bug. Then, for each target program portion, the engineer identifies a sequence of instructions (referred to herein as a "strand") that, if executed, indicates the target program portion is currently executing or is likely to execute in the near future. The engineer then subjects the strand, namely its instruction information, to be accumulated according to the mathematical operation (the same mathematical operation used by the fingerprint unit to generate dynamic fingerprints) to generate a result. The result is stored in a database or file as the static fingerprint associated with the program portion. The generation of the static fingerprints may be performed by various means. For example, the engineer may provide the fingerprint gathering criteria associated with the strand to a software program, such as a functional simulator of the microprocessor, and then run the program on the functional simulator and instruct the functional simulator to output the result of the fingerprint engine portion of the functional simulator when it encounters the stop condition, which result will be the static fingerprint for the strand. Alternatively, the engineer may perform a similar operation using the microprocessor itself, perhaps in a laboratory environment in which the microprocessor may be specially configured in a debug/test configuration to output the static fingerprint and/or in which the microprocessor is connected to a piece of test equipment that provides test vectors to the microprocessor and receives test results. After the engineer has collected the target static fingerprints, the engineer creates a table that associates each of the static fingerprints with: (1) the configuration settings that optimize the functional units of the microprocessor for processing the program portion associated with the strand, and (2) the fingerprint gathering criteria.

It should be understood that the detection of a match of a static fingerprint with a dynamic fingerprint does not uniquely identify the strand associated with the program portion in an absolute sense, but instead indicates a high probability that the strand has been executed. This is somewhat analogous to the manner in which human a fingerprint does not necessarily uniquely identify a human in an absolute sense. That is, in a relatively small number of cases the fingerprint unit may also indicate a match for an instruction sequence other than the strand from which the static fingerprint is generated—referred to as an "alias" strand.

A functional unit is hardware or a combination of hardware and software within a microprocessor that performs a function associated with the processing of an instruction. Examples of functional units include, but are not limited to, an instruction fetch unit, a branch prediction unit, an instruction format unit, an instruction translation unit, a register renaming unit, an instruction scheduling unit, an execution unit (such as an integer unit, a floating point unit, a branch unit, a single issue multiple data (SIMD) unit, a multimedia unit, load unit, a store unit), a reorder buffer, a retire unit, a cache memory, a data prefetch unit, a power management unit, a memory management unit, and a store-collision detection unit.

A functional unit is dynamically reconfigurable if its configuration setting may be changed while the microprocessor is operating. It should be understood that in order to change the configuration setting of a dynamically reconfigurable functional unit, the microprocessor might first pause processing of instructions by the dynamically reconfigurable functional unit and/or the entire microprocessor while the configuration setting change is being made. For example, in one embodiment microcode changes the configuration setting by writing a value to configuration registers. The microcode routine may serialize execution of instructions before the new configuration settings are written and until the new configuration settings take effect.

A configuration setting of a functional unit is state that causes the functional unit to perform its function in different manners when the state has different values. The different manners affect the performance, power consumption and/or correctness with which the functional unit performs its functions.

EMBODIMENTS

Referring now to FIG. 1, a block diagram illustrating a microprocessor 100 is shown. The microprocessor 100 includes dynamically reconfigurable functional units 128, configuration registers 124, a reconfiguration unit 104, one or more fingerprint units 102, a fingerprint programming register 132 (such as a model specific register (MSR)), and a table of static fingerprints and associated configuration settings and fingerprint generation criteria 126. Although not shown, the microprocessor 100 may also include functional units that are not dynamically reconfigurable. In one embodiment, the microprocessor 100 includes a superscalar out-of-order execution microarchitecture, although the dynamic reconfiguration described herein may be performed on a microprocessor including different microarchitectures. In one embodiment, the microprocessor 100 includes an x86 instruction set architecture, although the dynamic reconfiguration described herein may be performed on a microprocessor including different instruction set architectures.

The configuration registers 124 hold configuration settings and provide the configuration settings to the dynamically reconfigurable functional units 128 to control particular aspects of their operation. Examples of different operational aspects that may be dynamically reconfigured by the configuration settings include, but are not limited to, the following.

A data prefetch configuration setting configures how data is prefetched from system memory into the various cache memories of the microprocessor 100. For example, the microprocessor may prefetch highly likely predicted data directly into the L1 data cache, and/or to prefetch less likely predicted data into a dedicated prefetch buffer separate from the L1 or L2 data caches. For another example, data prefetching by the data prefetcher may be disabled for applications that consistently trigger unneeded prefetches. For another example, the data prefetcher may be disabled from performing prefetches requested by prefetch instructions in a software application because they tend to negatively interact with prefetches initiated internally by the microprocessor 100.

A branch prediction configuration setting configures the manner in which the microprocessor 100 predicts branch instructions. For example, the number of branch instructions that the branch predictor can predict from each line of the instruction cache may be configured. Additionally, the number of unique branch prediction mechanisms used by the branch predictors may be configured. Furthermore, the branch predictors may be configured to assume whether a reverse JZ (jump on zero) branch instruction is usually taken or not taken. Still further, a hashing algorithm used for indexing into a branch target address cache (BTAC) within the branch predictors may be configured. Finally, the branch predictors may be configured to temporarily disable branch prediction altogether, or to temporarily disable portions of the branch prediction mechanism, such as a branch target address cache (BTAC) within the branch predictors, if one or more of the currently running software applications in the predetermined list tend to execute highly unpredictable branch instructions.

An instruction cache eviction configuration setting configures the algorithm the microprocessor 100 uses to evict instructions from the instruction cache.

A suspend execution configuration setting configures whether the microprocessor 100 temporarily suspends executing program instructions. For example, the microprocessor 100 may be configured to temporarily suspend executing instructions in response to determining that the idle process of the operating system has been executing for a predetermined amount of time.

An L1 instruction cache memory size configuration setting, an L1 data cache memory size configuration setting, and an L2 cache memory size configuration setting configure the size of the L1 instruction cache, L1 data cache, or L2 cache memory, respectively. For example, the cache memory sizes may be configured based on the size of the working data set of one or more of the currently running software applications.

A translate/format configuration setting configures how the instruction translator/formatter translates and/or formats instructions. For example, the number of instructions the instruction translator/formatter translates and/or formats each clock cycle may be configured. For example, the instruction translator/formatter may be configured to translate and/or format only a single instruction per clock cycle in order to lower the power consumption of the microprocessor 100 when this will suffice based on the running applications. Additionally, the translator/formatter may be disabled from merging instructions in order to reduce power consumption.

A speculative tablewalk configuration setting configures whether a memory management unit (MMU) of the microprocessor 100 performs speculative page tablewalks in response to a translation lookaside buffer (TLB) miss. For example, the MMU may be configured to disable speculative tablewalks for an application that causes the speculations to be consistently incorrect, thereby evicting otherwise useful entries in the TLB. In one embodiment, the magnitude of the speculation of the tablewalk may be configured. For example, the MMU may be configured to only perform a speculative page tablewalk after all older store operations have been retired, or after all older store operations have their addresses resolved, or without regard for older store operations. Additionally, the MMU may be configured to control both data and code speculative tablewalks independently. Furthermore, the MMU may be configured to perform the tablewalk speculatively but not update the TLB speculatively. Finally, the MMU may be configured to distinguish what types of micro-ops or hardware functions can speculatively tablewalk such as various software or hardware prefetches.

An L1 cache miss behavior configuration setting configures whether MMU, in response to a miss in the L1 instruction cache, requests data from the L2 cache and the processor bus in a serial or parallel fashion.

A forwarding hash configuration setting configures the algorithm used by the microprocessor 100 to hash virtual address bits in address comparisons to detect whether the microprocessor 100 should perform a data forwarding operation, such as to a load instruction from an older, unretired store instruction, or between a load queue and a fill queue. For example, the following may be configured: the number of bits in addition to the page index bits of the virtual address that will be compared, which of the non-page index bits will be hashed to generate those bits, and how the chosen bits will be hashed.

A queue size configuration setting configures the usable size of various queues within the microprocessor 100, such as store queues, load queues, and cache line fill queues. For example, the various queues may be configured to smaller sizes in order to reduce the amount of power consumption when smaller queues will suffice based on the running applications.

An issue size configuration setting configures the number of instructions that the microprocessor 100 will issue to the various execution units in a single clock cycle. For example, this may be configured to a relatively smaller value in order to reduce the amount of power consumption when a smaller number of instructions issued per clock cycle will suffice based on the running applications.

Reorder buffer (ROB) size configuration setting configures the number of usable entries in the ROB. For example, the device driver may configure the number of ROB entries to a relatively small number in order to reduce the amount of power consumption when a smaller number of ROB entries will suffice based on the running applications.

An out-of-orderness configuration setting configures aspects of how the microprocessor 100 employs out-of-order execution of instructions. For example, the microprocessor 100 may be configured to execute instructions in strict program order (i.e., no out-of-order execution). Additionally, the microprocessor 100 may be configured regarding how deep within the instruction window the instruction dispatcher may look for independent instructions to issue for execution to the execution units.

A load delay configuration setting configures whether a load delay mechanism of microprocessor 100 is disabled or enabled. In one embodiment, the microprocessor 100 speculatively issues a load instruction and may have to replay the load instruction if it depends upon an older store instruction from which the data is not yet available, which may be deleterious to performance. To reduce the likelihood of the replay, the load delay mechanism selectively delays the issue of a load instruction based on past history of the load instruction having been replayed. However, some software applications may exhibit a tendency to perform worse when the load delay mechanism is enabled. Thus, for example, the load delay mechanism may be disabled for a software application that exhibits this tendency.

A non-temporal load/store configuration setting configures the microprocessor 100 behavior for load/store instructions that include a non-temporal data hint to prevent the microprocessor 100 from caching their data. Some software applications may have been written to employ the non-temporal load/store instructions with the assumption that the data caches within the microprocessor 100 are smaller than the actual data cache sizes of the microprocessor 100 and might execute faster if the data were cached. Thus, for example, the microprocessor 100 may be configured to cache data specified by load/store instructions that include a non-temporal data hint. Additionally, the number of load buffers within the microprocessor 100 that are available to load/store instructions that include a non-temporal data hint may be configured.

Another configuration setting selectively configures a hardware page directory cache (PDC) of the microprocessor 100 to contain either page directory entries (PDE) or fourth-level page table (PML4) entries.

Another configuration setting selectively configures whether both, one or none of data and code TLB entries are placed into the L2 TLB of the microprocessor 100. Another configuration setting configures the size of the L2 TLB.

Another configuration setting selectively configures whether a software prefetch line allocation is ensured. That is, the MMU may be configured to wait to complete until it either hits or has pushed a request for the line or even complete but continue to try to allocate the line in the wake.

Another configuration setting configures whether self-modifying code (SMC) detection is enabled or disabled. Additionally, if SMC detection is enabled, the microprocessor 100 may be configured to correct early or late, and to perform a full machine flush or not.

Another configuration setting configures whether various parallel arbitrations in the load and/or store pipelines of the microprocessor 100 are enabled or disabled. For example, a load effective address (LEA) generation in the store pipeline does not need to arbitrate for the entire pipeline because it produces the result early, so the microprocessor 100 may be configured to allow another operation that requires the full pipeline to arbitrate at the same time. Furthermore, the load pipeline may be selectively configured to allow arbiters that do not need to read the cache to arbitrate in parallel with those that do.

Another configuration setting configures the degree of speculation regarding write-combine loads. For example, the write-combine loads may be fully speculative, speculative but still in order, or non-speculative. A similar configuration may be made with respect to loads associated with the x86 MOVNTDQA instruction.

Another configuration setting configures the MMU to disable or enable whether the MMU indicates to an instruction scheduler of the microprocessor 100 that after a load miss has required newer micro-operations to replay, the load is likely to complete now. This allows the scheduler to speculatively schedule dependent micro-operations to line up with the load result forwarding stage rather than waiting for the result to be provided before scheduling. This is a speculation that the load will now have a valid result, but if not, another replay is required.

Another configuration setting configures forwarding paths of the microprocessor 100 to selectively disable forwarding. This configuration setting may be particularly helpful in avoiding a design bug that is detected subsequent to design of the microprocessor 100 and which might otherwise manifest itself when a specific program portion is executed by the microprocessor 100. Examples of forwarding that may be selectively disabled include, but are not limited to, register result forwarding and load-store forwarding.

Another example of a dynamic reconfiguration of a dynamically reconfigurable functional unit 128 is to cause the register renaming unit to flush queues that hold load-store dependencies that are used by the register renaming unit to affect load instruction scheduling in order to reduce load replays caused by load-store collisions. Generally, the functional units 128 may be dynamically reconfigured to flush accumulated performance feature state that is known or suspected to be false or malformed in association with a specific program portion.

Another example of a dynamic reconfiguration of a dynamically reconfigurable functional unit 128 is to cause one or more cache lines, or an entire cache memory, to be flushed in order to avoid a potential data coherency. This may be particularly helpful in avoiding a design bug might otherwise manifest itself when a specific program portion is executed by the microprocessor 100.

Another example of a dynamic reconfiguration of a dynamically reconfigurable functional unit 128 is to temporarily change the behavior of microcode that implements an architectural instruction for a specific instance of the architectural instruction. For example, the microcode executes an alternate code path in the specific instance of the architectural instruction, such as included in a specific program portion, and executes a normal code path in other instances of the architectural instruction. Again, this may be particularly helpful in avoiding a design bug.

The reconfiguration unit 104 reads the configuration settings 126 associated with a matching static fingerprint and writes the configuration settings 126 to the configuration registers 124 to reconfigure the dynamically reconfigurable functional units 128 of the microprocessor 100. In one embodiment, the reconfiguration unit 104 comprises microcode executed by the microprocessor 100 that performs the read of the configuration settings 126 associated with the matching static fingerprint and the write of the configuration settings 126 to the configuration registers 124. Preferably, when the fingerprint unit 102 detects a fingerprint match, it causes control to trap to the microcode. In an alternate embodiment, the reconfiguration unit 104 comprises hardware control logic that reads the configuration settings 126 associated with the matching static fingerprint and writes the configuration settings 126 to the configuration registers 124 in response to the fingerprint unit 102 signaling the fingerprint match. The reconfiguration unit 104 and fingerprint unit 102 communicate via control signals 144.

It should be understood that not all functional units of the microprocessor 100 are dynamically reconfigurable. It should also be understood that when the reconfiguration unit 104 reconfigures the dynamically reconfigurable functional units 128, it may not write to every configuration register 124 and every dynamically reconfigurable functional unit 128 may not be reconfigured, although at least one configuration register 124 will be written and at least one dynamically reconfigurable functional unit 128 will be reconfigured.

The fingerprint unit 102 receives instruction information 142 from the functional units 128 of the microprocessor 100 as they execute instructions and accumulates the instruction information 142 according to the mathematical operation to generate a dynamic fingerprint, which it compares to the static fingerprints 126. Preferably, the fingerprint unit 102 comprises a plurality of fingerprint units 102 each of which generates a dynamic fingerprint according to a different fingerprint generation criteria and compares it to a static fingerprint. In one embodiment, there are four separate fingerprint units 102, and they may be logically chained together to accomplish detection of relatively complex instruction sequences. An embodiment of the fingerprint unit 102 is described in more detail with respect to FIG. 2.

The fingerprint MSR 132 is writable by software, such as a device driver 150 or BIOS, to control the fingerprint unit 102 and to populate the table of static fingerprints and their associated configuration settings and fingerprint generation criteria 126.

One use of embodiments of dynamic reconfiguration of a microprocessor described herein is to improve the performance and/or reduce the power consumption of the microprocessor 100 when executing known portions of programs whose performance and/or power consumption may be significantly affected by dynamically reconfiguring the microprocessor 100 to known configurations.

Another use of dynamic reconfiguration embodiments described herein is to prevent the microprocessor 100 from functioning incorrectly when it processes a portion of a program which, if the program portion were executed by the microprocessor 100 while in a first known configuration, will result in a functional error but which, if executed by the microprocessor 100 while in a second known configuration, will result in a correct result. For example, the microprocessor 100 may produce a functional error if it executes the program portion when the data prefetcher is configured to perform a particularly aggressive mode of data prefetching; whereas, the microprocessor 100 does not produce the functional error when it executes the program portion when the data prefetcher is configured to perform a less aggressive mode of data prefetching or data prefetching is turned off entirely. Examples of functional errors include, but are not limited to, corrupt data, a hang condition such as a deadlock or livelock, inordinately slow performance, and an exception condition the operating system is not prepared to remedy. The bug in the design of the microprocessor 100 that causes the functional error may not have been discovered until after the microprocessor 100 was manufactured in large volumes and/or after it was already shipped to consumers. In such cases, it may be advantageous to fix the problem by dynamically reconfiguring the microprocessor 100 rather than redesigning the microprocessor 100 and/or recalling or not selling the parts that have the bug.

A potential benefit of the dynamic reconfiguration embodiments described herein is the microprocessor 100 identifies portions of software applications at a relatively fine granularity. This may be particularly useful for software applications that include different portions that may benefit from the functional units of the microprocessor 100 being dynamically reconfigured according to different configurations. For example, a video game may include a program load portion, an initialization portion, a graphics calculation portion, a user input reception portion, and a strategy calculation portion. Each of these program portions may perform better with a different configuration of the functional units of the microprocessor 100. It should be understood that the microprocessor 100 "performs better" if it executes the program portion faster, uses less power to execute the program portion and/or correctly executes the program portion.

Figure 2:
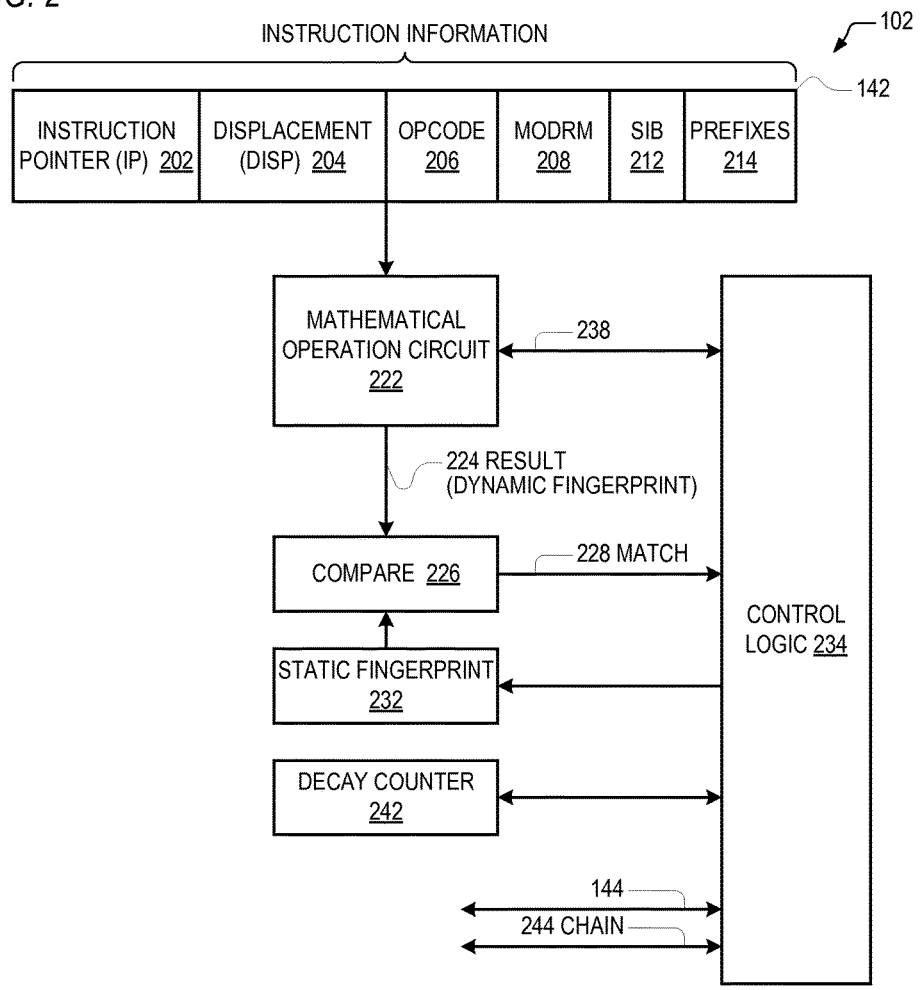
FIG. 2 is a block diagram illustrating the fingerprint unit of FIG. 1 in more detail.

Referring now to FIG. 2, a block diagram illustrating the fingerprint unit 102 of FIG. 1 in more detail is shown. The fingerprint unit 102 includes a mathematical operation circuit 222, compare logic 226, a static fingerprint 232, a decay counter 242, and control logic 234.

The mathematical operation circuit 222 receives the instruction information 142 from the functional units 128 of FIG. 1 and generates a result 224, which is a dynamic fingerprint, by accumulating the instruction information 142 according to a mathematical operation, examples of which are described above. In the embodiment of FIG. 2, the instruction information 142 includes the instruction pointer 202 (i.e., instruction address) of the instruction, a displacement field 204, opcode field 206, modRM field 208, SIB field 212 and prefixes 214 from the instruction. In other embodiments other instruction fields comprise the instruction information 142, particularly embodiments that employ a different instruction set architecture than the x86 architecture. Preferably, the instruction set architecture has variable length instructions (e.g., x86 instructions are variable length), and the fetch unit 128 includes an instruction format unit 128 that receives blocks of instruction bytes as they are fetched from an instruction cache 128 and formats them into the individual instructions, and the mathematical operation circuit 222 receives the instruction information 142 from the instruction format unit 128 of the microprocessor 100 each time it formats an instruction. In one embodiment, the instruction format unit 128 is capable of formatting up to three instructions per clock cycle and providing the instruction information 142 for the up to three instructions to the mathematical operation circuit 222 per clock cycle. In other embodiments in which the instruction set architecture has fixed-length instructions, the instruction information 142 may be provided by the fetch unit 128 as the instructions are fetched from the instruction cache 128.

Preferably, the mathematical operation circuit 222 comprises a multiple input shift register (MISR) that uses a maximum count polynomial. Preferably, as each instruction is formatted, the (selectively filtered) instruction information 142 is Boolean exclusive-OR'ed (XOR) with the current state of the MISR 1-bit right-shifted with the left-most input bit being the XOR of the MISR taps. In one embodiment, the MISR is 50 bits wide, and the taps of the MISR are 49, 9 and 0 to accomplish the maximum count polynomial. In such an embodiment, the likelihood of an alias strand generating a false match is approximately 1:2^50 (one chance in 2 to the 50$^{th}$ power). As described above, although the strand identification may not be unique in an absolute sense, the identification may be sufficiently unique for most purposes, such as improving performance and ameliorating the effect of design bugs. In the rare case of an alias strand false match, the consequence may be potentially slower performance, greater power consumption and/or inability to correct for a bug in the microprocessor 100 design. As described above, the fingerprint unit 102 may receive instruction information 142 for multiple instructions per clock cycle, and the mathematical operation circuit 222 is configured to perform the mathematical operation to accumulate all of the multiple instruction information 142 in a single clock cycle. Specifically, in the MISR embodiment, the mathematical operation circuit 222 is configured to XOR all of the multiple instruction information 142 in a single clock cycle.

The mathematical operation circuit 222 generates the result based on information 238 received from the control logic 234, which includes fingerprint generation criteria 238. As described above, the fingerprint generation criteria 238 includes start conditions, stop conditions and reset conditions that control when the mathematical operation circuit 222 accumulates the instruction information 142 to generate the dynamic fingerprint 224. The fingerprint generation criteria 238 also specifies the combination of the portions (202, 204, 206, 208, 212, 214) of the instruction information 142 the mathematical operation circuit 222 will accumulate to generate the dynamic fingerprint 224, and by implication the portions that will be filtered out. Preferably, binary zeroes are inserted for the bits corresponding to the portions that are filtered out.

The comparator 226 compares the dynamic fingerprint generated by the mathematical operation circuit 222 with the static fingerprint 232 to generate a true value on a match signal 228 provided to the control logic 234 if the two fingerprints match. In one embodiment, the comparator 226 only makes the comparison when a stop condition has been reached. Preferably, a device driver and/or microcode loads the static fingerprint 232 and fingerprint generation criteria 238. When the control logic 234 detects a true value on the match signal 228, the control logic 234 communicates the match to the reconfiguration unit 104 via the control signals 144. Additionally, the control logic 234 communicates the match to other fingerprint units 102 via a chain signal 244, as described in more detail below with respect to FIGS. 6 and 7. The control logic 234 also receives chain 244 indications from the other fingerprint units 102. Furthermore, the control logic 234 may load a decay counter 242 in response to the match. Operation of the decay counter 242 is described below in more detail with respect to FIG. 5.

Figure 3:
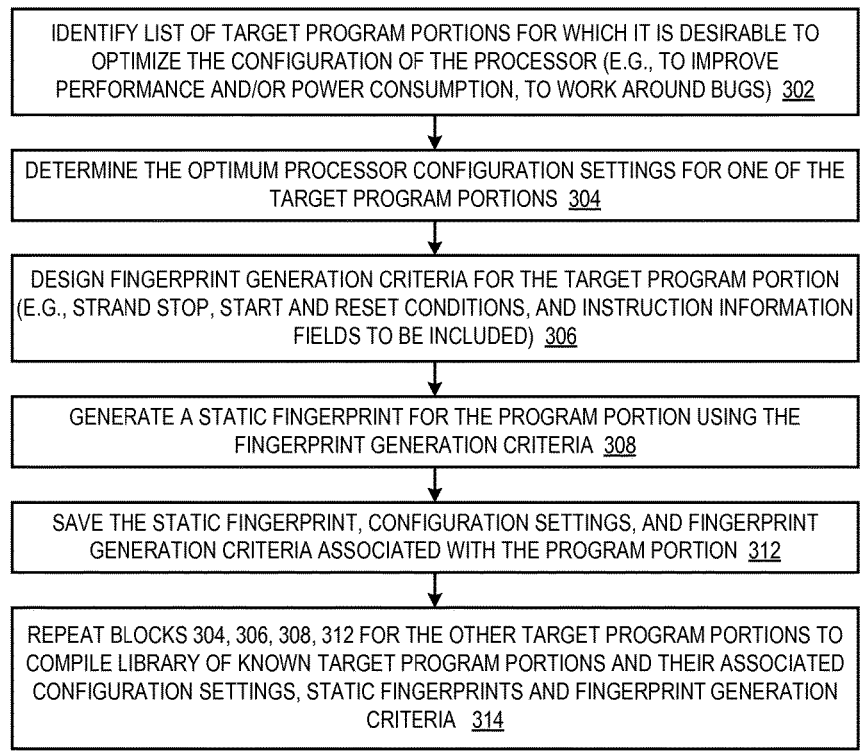
FIG. 3 is a flowchart illustrating a process for generating a library of known target program portions and their associated static fingerprints, configuration settings, and fingerprint generation criteria.

Referring now to FIG. 3, a flowchart illustrating a process for generating a library 160 (FIG. 1) of known target program portions and their associated static fingerprints, configuration settings, and fingerprint generation criteria is shown. Flow begins at block 302.

At block 302, one or more engineers identifies a list of program portions for which it is desirable to optimize the configuration of the dynamically reconfigurable functional units 128 of the microprocessor 100, e.g., to improve its performance (both in terms of faster program portion execution or lower power consumption) and/or provide a bug fix. Flow proceeds to block 304.

At block 304, the engineer determines the optimum configuration settings for the dynamically reconfigurable functional units 128 for one of the program portions identified at block 302. Flow proceeds to block 306.

At block 306, the engineer identifies a strand associated with the program portions identified at block 304 and designs fingerprint generation criteria that may be used to generate a fingerprint for the strand. Flow proceeds to block 308.

At block 308, the engineer generates a static fingerprint for the strand associated with the program portion using the fingerprint generation criteria designed at block 306. Flow proceeds to block 312.

At block 312, the engineer saves the static fingerprint, configuration settings, and fingerprint generation criteria associated with the program portion. Flow proceeds to block 314.

At block 314, the engineer repeats blocks 304, 306, 308 and 312 for each of the other program portions identified at block 302 to compile a library. Flow ends at block 314.

Figure 4:
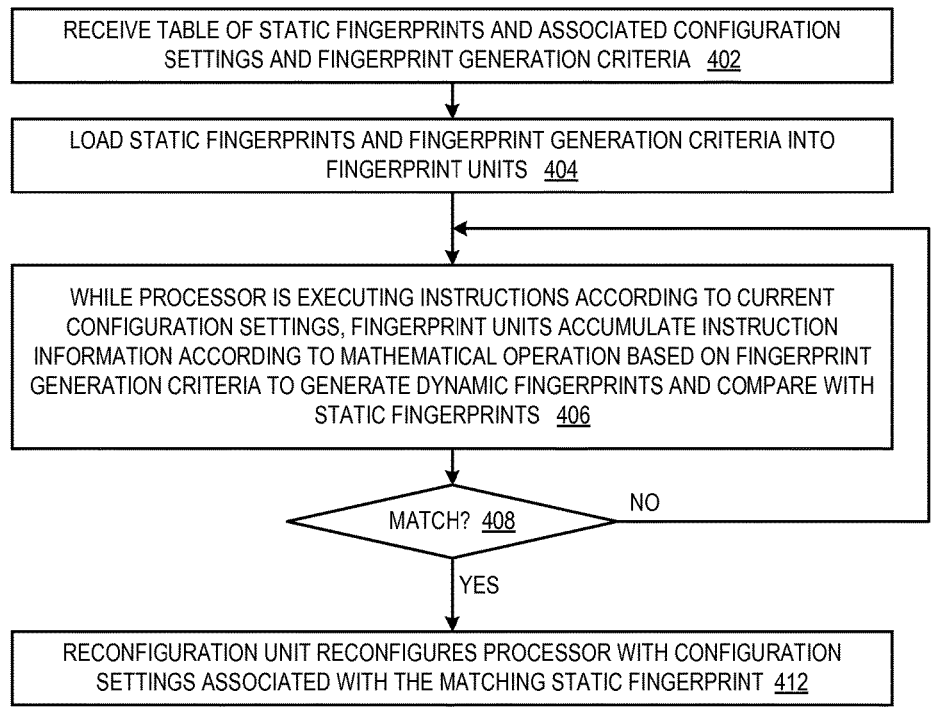
FIG. 4 is a flowchart illustrating operation of the microprocessor to dynamically reconfigure itself.

Referring now to FIG. 4, a flowchart illustrating operation of the microprocessor 100 to dynamically reconfigure itself is shown. Flow begins at block 402.

At block 402, the microprocessor 100 receives the table 126 of static fingerprints and associated configuration settings and fingerprint generation criteria of FIG. 1. Preferably, the table of information 126 comprises a portion of a library compiled according to the process of FIG. 3. The table of information 126 is programmable. Preferably, a device driver provides the table of information 126 to the microprocessor 100. For example, the device driver may determine from the operating system that one or more software applications are running that are identified in the library and, in response, provide the static fingerprints, configuration settings and fingerprint generation criteria 126 associated with the program portions of the running software applications. Alternatively, system firmware, such as BIOS, provides the table of information 126 to the microprocessor 100, particularly in a situation in which the dynamic reconfiguration is being used to fix a bug. Further alternatively, the table of information 126 may be loaded into the microprocessor 100 via a patch to the microcode. Preferably, the microcode patch is loaded just after the microprocessor 100 is reset and the fingerprint generation criteria is such that it persists indefinitely, or at least until the microprocessor 100 is reset again. This also may be particularly helpful in a situation in which the dynamic reconfiguration is being used to fix a bug that would otherwise manifest early in the execution of software after the microprocessor 100 is reset. The table 126 may include information for a greater number of program portions than the number of fingerprint units 102, and microcode of the microprocessor 100 may dynamically load the fingerprint units 102 with static fingerprints and fingerprint generation criteria without device driver intervention as the program runs. Preferably, the table of information is received into a private memory of the microprocessor 100 that is not accessible by architectural programs but is accessible by microcode of the microprocessor 100. Flow proceeds to block 404.

At block 404, the fingerprint units 102 are loaded with the static fingerprints and fingerprint generation criteria. As described above, this may occur when the device driver writes the table 126 and/or when microcode detects events, such as that a fingerprint unit 102 has detected a fingerprint match (e.g., at block 703 of FIG. 7). Flow proceeds to block 406.

At block 406, while the functional units 128 are executing instructions according to the current configuration settings in the configuration registers 124, the fingerprint units 102 accumulate the instruction information 142 according to the mathematical operation based on the fingerprint generation criteria loaded at block 404 to generate dynamic fingerprints 224 and to compare them with the static fingerprints 232 loaded at block 404. Flow proceeds to decision block 408.

At decision block 408, the fingerprint units 102 (e.g., the comparators 226 and control logic 234) determine whether there is a match between the static and dynamic fingerprints. If so, flow proceeds to block 412; otherwise, flow returns to block 406.

At block 412, the control logic 234 signals 144 the reconfiguration unit 104 of the match and the reconfiguration unit 104 responsively reconfigures the dynamically reconfigurable functional units 128 (e.g., by writing the configuration registers 124) with the configuration settings 126 associated with the static fingerprint 232 that was matched to the dynamic fingerprint 224 at block 408. Flow ends at block 412.

Figure 5:
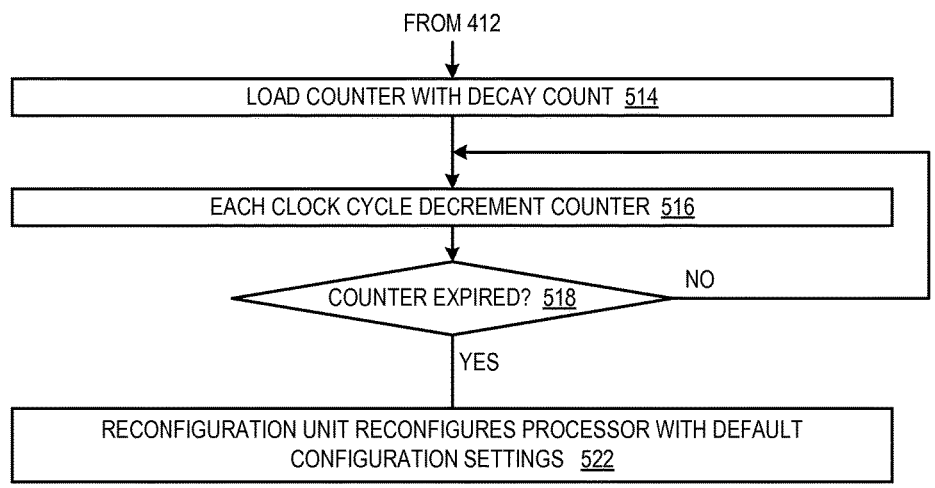
FIG. 5 is a flowchart illustrating further operation of the microprocessor to dynamically reconfigure itself.

Referring now to FIG. 5, a flowchart illustrating further operation of the microprocessor 100 to dynamically reconfigure itself is shown. Flow begins at block 502, preferably flowing from block 412 of FIG. 4.

At block 502, the control logic 234 loads the decay counter 242 with a decay count associated with the static fingerprint that was matched at block 408. Preferably, the decay count is included in the table 126 of FIG. 1. Flow proceeds to block 516.

At block 516, periodically—preferably each clock cycle—the decay counter 242 decrements. Flow proceeds to decision block 518.

At decision block 518, the control logic 234 determines whether the decay counter 242 has expired. If so, flow proceeds to block 522; otherwise, flow returns to block 516.

At block 522, the control logic 234 signals 144 the reconfiguration unit 104 of the decay counter 242 expiration and the reconfiguration unit 104 responsively reconfigures the dynamically reconfigurable functional units 128 with the default configuration settings 126. In one embodiment, the default configuration settings are programmed into the microcode. In one embodiment, the default configuration settings are included in the table 126. In one embodiment, the default configuration settings are the previous configuration settings before the dynamic reconfiguration performed at block 412, i.e., the current configuration settings according to which the microprocessor 100 is executing instruction at block 406. In one embodiment, one subset of the configuration settings are returned to their default values, whereas another subset of the configuration settings are retained at the values written at block 412. Preferably, the subsets are defined in the table 126. Flow ends at block 522.

Figure 6:
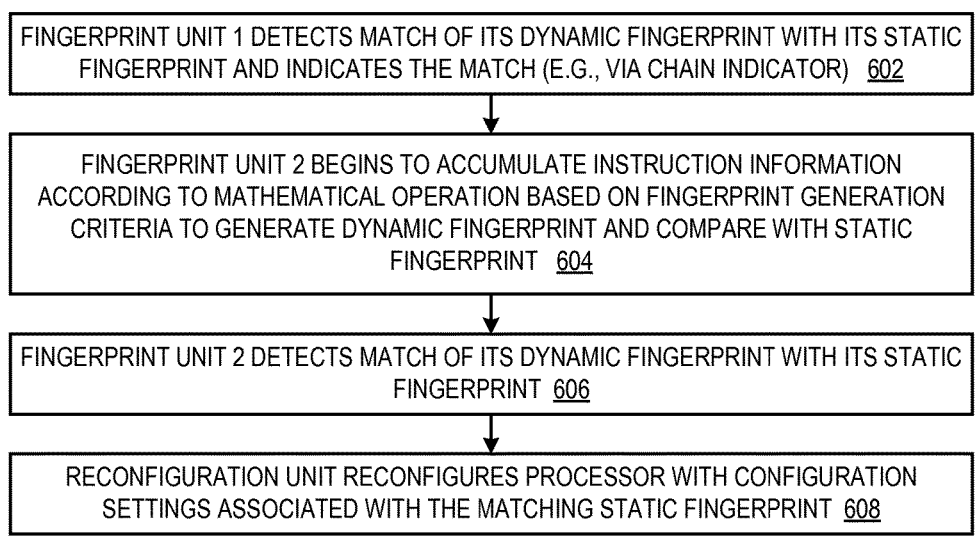
FIG. 6 is a flowchart illustrating operation of the microprocessor to dynamically reconfigure itself according to an alternate embodiment.

Referring now to FIG. 6, a flowchart illustrating operation of the microprocessor 100 to dynamically reconfigure itself according to an alternate embodiment is shown. Flow begins at block 602.

At block 602, one of the fingerprint units 102 (denoted fingerprint unit 1) detects a match of its dynamic fingerprint 224 and its static fingerprint 232 and indicates the match, e.g., via the chain indicator 244. Flow proceeds to block 604.

At block 604, a different fingerprint unit 102 (denoted fingerprint unit 2) receives the indication generated by fingerprint unit 1 at block 602 and responsively begins to accumulate the instruction information 142 according to the mathematical operation based on the fingerprint generation criteria to generate dynamic fingerprints 224 and to compare them with the static fingerprints 232. Flow proceeds to block 606.

At block 606, fingerprint unit 2 detects a match of its dynamic fingerprint 224 with its static fingerprint 232. Flow proceeds to block 608.

At block 608, the control logic 234 signals 144 the reconfiguration unit 104 of the match found, and the reconfiguration unit 104 responsively reconfigures the dynamically reconfigurable functional units 128 with the configuration settings 126 associated with the static fingerprint 232 that was matched to the dynamic fingerprint 224 at block 606. Flow ends at block 608.

Figure 7:
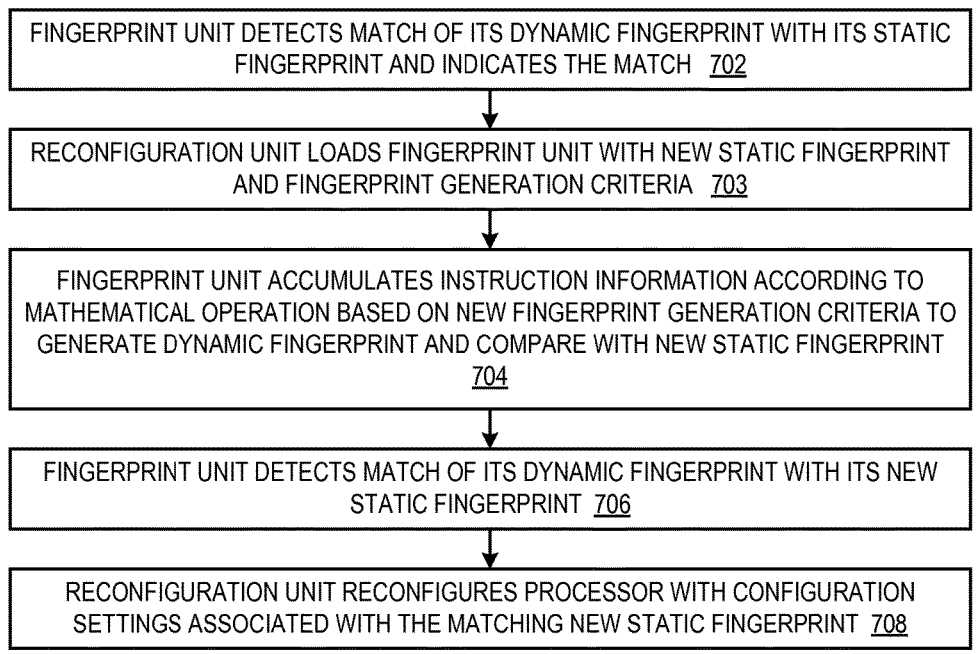
FIG. 7 is a flowchart illustrating operation of the microprocessor to dynamically reconfigure itself according to an alternate embodiment.

Referring now to FIG. 7, a flowchart illustrating operation of the microprocessor 100 to dynamically reconfigure itself according to an alternate embodiment is shown. Flow begins at block 702.

At block 702, one of the fingerprint units 102 detects a match of its dynamic fingerprint 224 and its static fingerprint 232 and indicates the match, e.g., via the control signals 144. Flow proceeds to block 703.

At block 703, the reconfiguration unit 104 loads the fingerprint unit 102 with a new static fingerprint 232 and its associated fingerprint generation criteria in response to the indication of the match found at block 702. Flow proceeds to block 704.

At block 704, the fingerprint unit 102 accumulates the instruction information 142 according to the mathematical operation based on the new fingerprint generation criteria loaded at block 703 to generate dynamic fingerprints 224 and to compare them with the static fingerprints 232. Flow proceeds to block 706.

At block 706, the fingerprint unit 102 detects a match of its dynamic fingerprint 224 with its static fingerprint 232. Flow proceeds to block 708.

At block 708, the control logic 234 signals 144 the reconfiguration unit 104 of the new match found, and the reconfiguration unit 104 responsively reconfigures the dynamically reconfigurable functional units 128 with the configuration settings 126 associated with the new static fingerprint 232 that was matched to the dynamic fingerprint 224 at block 706. Flow ends at block 708.

Although FIG. 7 describes the fingerprint unit 102 being effectively chained to itself only once, preferably the fingerprint unit 102 may be chained to itself a larger number of times. Furthermore, although the chaining of only two fingerprint units 102 is described with respect to FIG. 6, preferably all of the fingerprint units 102 may be chained together in a similar fashion. Furthermore, the embodiment of FIG. 6 may be combined with the embodiment of FIG. 7 such that the set of static fingerprints currently loaded into the fingerprint units 102 for which matches are being sought varies dynamically such that a chain of program portions whose number is longer than the number of fingerprint units 102 may be detected and the dynamically reconfigurable functional units 128 dynamically reconfigured as desired.

Figure 8:
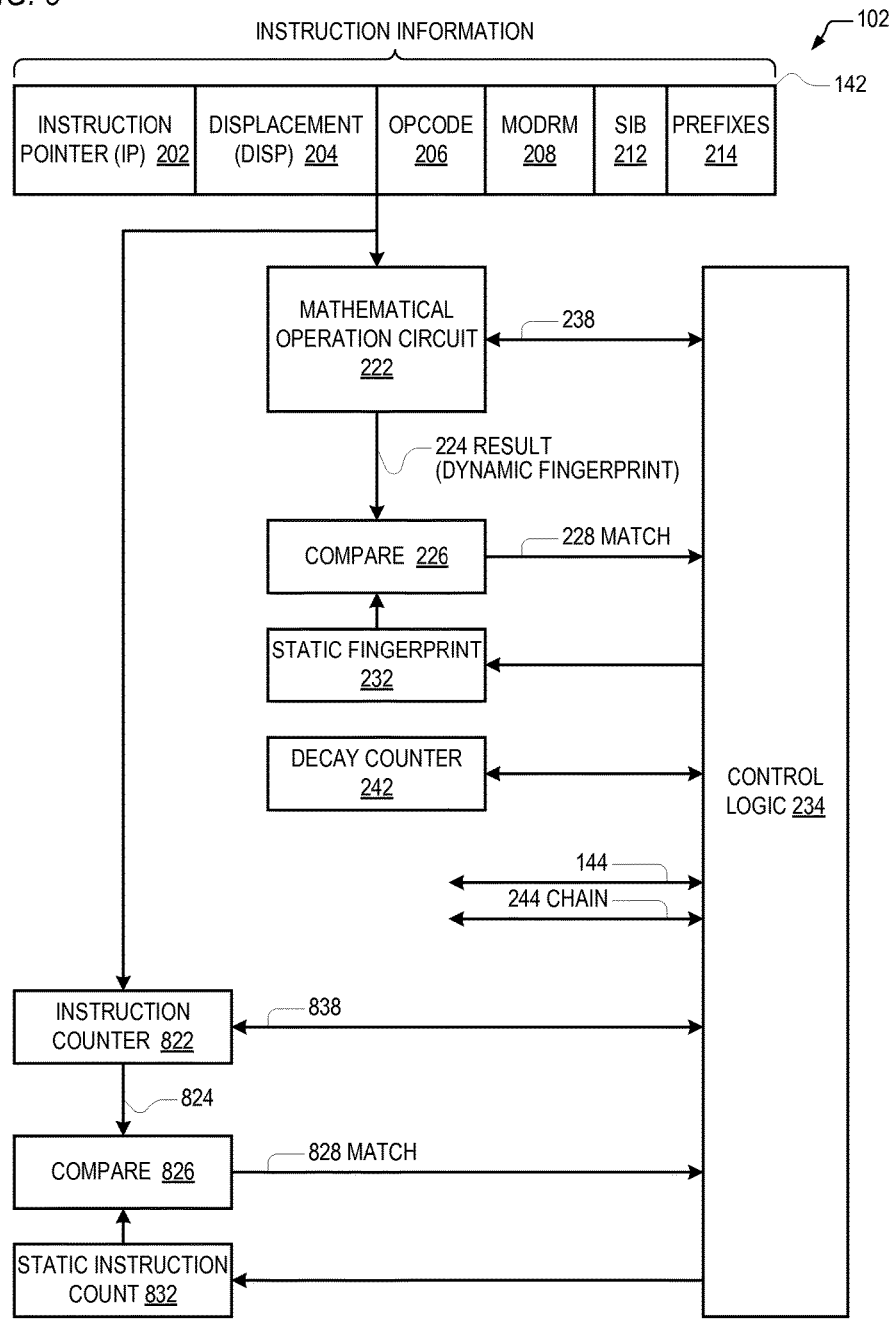
FIG. 8 is a block diagram illustrating the fingerprint unit of FIG. 1 according to an alternate embodiment.

Referring now to FIG. 8, a block diagram illustrating the fingerprint unit 102 of FIG. 1 according to an alternate embodiment is shown. The fingerprint unit 102 of FIG. 8 is similar to the fingerprint unit 102 of FIG. 2; however, it also includes an instruction counter 822, a second comparator 826, and a static instruction count 832.

The instruction counter 822 receives the instruction information 142 from the functional units 128 of FIG. 1 and generates a result 824, which is a dynamic count, by incrementing the instruction count 824 each time it encounters an instruction of a type specified by instruction count generation criteria 838 received from the control logic 234. Preferably, the instruction count generation criteria 838 specifies the types of instructions to be counted. In one embodiment, the types of instructions to be counted include all instructions, subroutine call type instructions, return type instructions, NOP type instructions, and instructions that trap to microcode (i.e., that are implemented in microcode). In one embodiment, the mathematical operation circuit 222 only accumulates instruction information 142 only for instructions that are of the specified type that are counted by the instruction counter 822, whereas the instruction information 142 for excluded instruction types are not accumulated by the mathematical operation circuit 222. In one embodiment, the NOP instructions include other instructions than simply the single-byte x86 NOP instruction, such as multi-byte instructions that effectively function as NOP instructions (0x90), as described in more detail below with respect to FIG. 10.

The comparator 826 compares the dynamic instruction count 824 generated by the instruction counter 822 with the static instruction count 832 to generate a true value on a second match signal 828 provided to the control logic 234 if the two instruction counts match. In one embodiment, the comparator 826 only makes the comparison when a stop condition has been reached. Preferably, a device driver and/or microcode loads the static instruction count 832 and instruction count generation criteria 838. When the control logic 234 detects a true value on the match signal 828, the control logic 234 communicates the match to the reconfiguration unit 104 via the control signals 144. Additionally, the control logic 234 communicates the match to other fingerprint units 102 via the chain signal 244. The control logic 234 may load the decay counter 242 in response to the match. Preferably, the static instruction count 832 and instruction count generation criteria 838 are compiled in the library of known target program portions in a manner similar to that described above with respect to FIG. 3.

Figure 9:
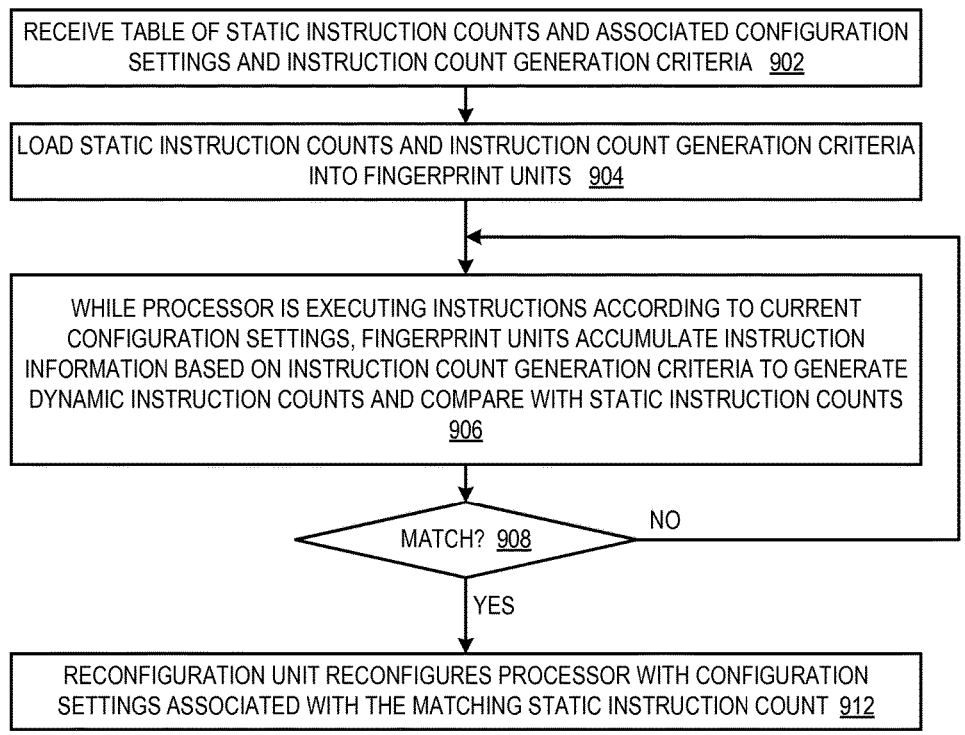
FIG. 9 is a flowchart illustrating operation of the microprocessor to dynamically reconfigure itself.

Referring now to FIG. 9, a flowchart illustrating operation of the microprocessor 100 to dynamically reconfigure itself is shown. FIG. 9 is similar in some ways to FIG. 4; however, FIG. 9 describes operation of the fingerprint unit 102 to dynamically reconfigure the microprocessor 100 in response to detecting a static instruction count rather than a static fingerprint, as will now be described. However, it should be noted that the fingerprint units 102 may be employed to detect both fingerprints and instruction counts simultaneously. Additionally, the fingerprint units 102 may operate in a chained fashion (e.g., as described with respect to FIGS. 6 and 7) for fingerprint units 102 loaded to detect both fingerprints and instruction counts as needed in order to dynamically reconfigure the microprocessor 100. Flow begins at block 902.

At block 902, the microprocessor 100 receives the table 126 of static instruction counts and associated configuration settings and instruction count generation criteria of FIG. 1. Flow proceeds to block 904.

At block 904, the fingerprint units 102 are loaded with the static instruction counts and instruction count generation criteria. Flow proceeds to block 906.

At block 906, while the functional units 128 are executing instructions according to the current configuration settings in the configuration registers 124, the fingerprint units 102 counts instructions based on the instruction count generation criteria loaded at block 904 to generate dynamic instruction counts 824 and to compare them with the static instruction counts 832 loaded at block 904. Flow proceeds to decision block 908.

At decision block 908, the fingerprint units 102 (e.g., the comparators 826 and control logic 234) determine whether there is a match between the static and dynamic instruction counts. If so, flow proceeds to block 912; otherwise, flow returns to block 906.

At block 912, the control logic 234 signals 144 the reconfiguration unit 104 of the match and the reconfiguration unit 104 responsively reconfigures the dynamically reconfigurable functional units 128 (e.g., by writing the configuration registers 124) with the configuration settings 126 associated with the static instruction count 832 that was matched to the dynamic instruction count 824 at block 908. Flow ends at block 912.

The dynamic reconfiguration embodiments described herein may involve cost tradeoffs. First, there is the cost of including the fingerprint unit hardware in terms of die real estate and power consumption. Second, there may be a cost associated with changing the configuration settings. The cost may be due to a need to temporarily suspend instruction processing to change the configuration settings. The cost may also be due to changing the settings that result in less performance in the rare instances in which an alias strand is identified.

Integrated NOP Slide Detector

An alternate use of the fingerprint unit described herein is for detecting a "NOP slide" (or "NOP sled").

A NOP slide is a sequence of consecutive NOP instructions in a memory from which a processor fetches and executes instructions. NOP slides are common employed by intruders to gain unauthorized access to a computer system. A NOP instruction is an instruction that performs an operation that does not affect the architectural state of the processor or which only affects the architectural state in a manner that is acceptable to the intruder attempting to gain unauthorized access to the computer system that includes the processor. The use of NOP slides is well known in the art of computer security, but will be described here briefly.

An intruder attempts to exploit a vulnerability of software running on the computer system that has executive privileges. By exploiting a vulnerability, the intruder causes "shellcode" to be written to the memory of the computer system. The shellcode performs an action advantageous to the intruder, such as providing executive privilege access to the system. The goal is to get control transferred to the shellcode. However, the nature of some of the exploited vulnerabilities is such that the target address in memory to which control is unwittingly transferred is not precisely known. Indeed, in some cases the target address is not known at all, and the intruder relies on a small statistical likelihood that the target address is the shellcode. A first way the intruder attempts to improve the small statistical likelihood is to write many copies of the shellcode to memory. A second way is to attempt the intrusion many different times. A third way is to employ a NOP slide.

The intruder writes a NOP slide in front of the shellcode, which provides a safe landing pad, so to speak, for the transfer of control. The NOP slide may be extremely large, for example, on the order of hundreds of thousands of bytes. As long as the target address to which control is transferred is somewhere within the NOP slide, the processor will simply execute NOP instructions until it reaches and executes the shellcode. Executing (a potentially large number of) NOP instructions is acceptable to the intruder since the NOP instructions do not alter the architectural state of the processor except in ways the intruder does not care about. The intruder may write many copies of the NOP slide+shellcode and may try many attempts to intrude using this technique, all of which combined may improve the likelihood of getting the shellcode executed.

Because NOP slides are known to be frequently included in intruder attacks, computer systems may analyze packets transmitted over a network to a computer system searching for a NOP slide. If a NOP slide is detected within a packet, the packet is discarded. This technique is often employed by network intrusion detection systems (NIDS). A disadvantage of a NIDS is that the packet may be encrypted, making it more difficult to detect a NOP slide. Furthermore, the intruder input including the NOP slide and shellcode may also be encrypted. An advantage of the embodiments of a NOP slide detector described herein is that they detect the sequence of NOP instructions within the processor as they are about to be executed and therefore are guaranteed to be decrypted by the time they are examined by the NOP slide detector.

Figure 10:
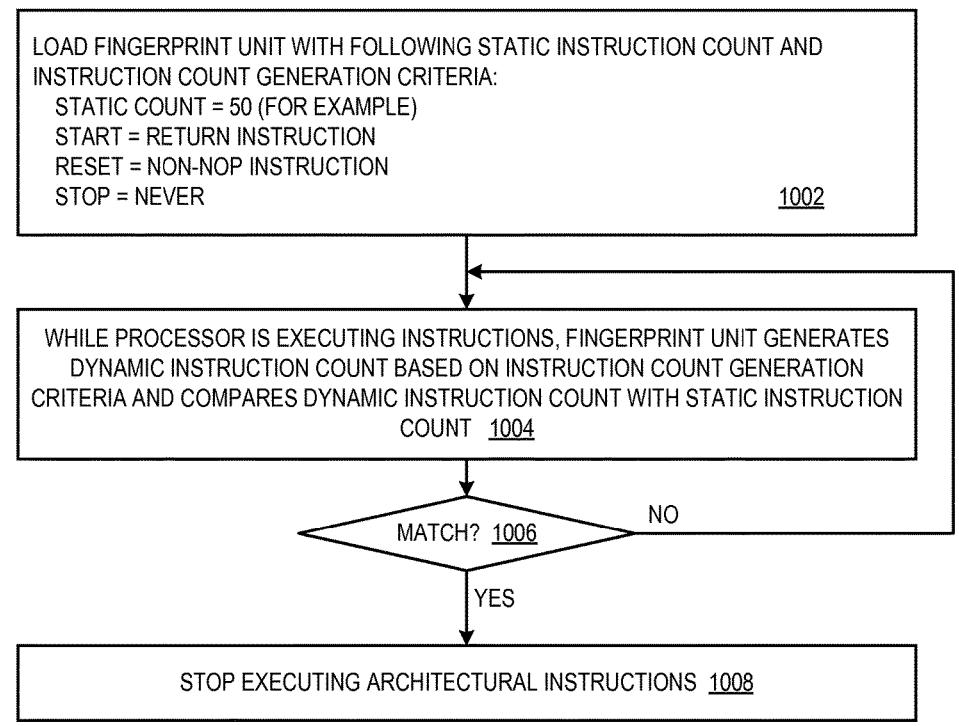
FIG. 10 is a flowchart illustrating operation of the microprocessor to detect a NOP slide.

Referring now to FIG. 10, a flowchart illustrating operation of the microprocessor 100 to detect a NOP slide is shown. In particular, the fingerprint unit 102 is employed as a NOP slide detector. A NOP instruction is an instruction that performs an operation that does not affect the architectural state of the processor (except to update the instruction pointer) or which only affects the architectural state in a predetermined manner. The microprocessor 100 designer designs the predetermined manner having in mind what is acceptable to an intruder attempting to gain unauthorized access to the computer system that includes the microprocessor 100, which may vary depending upon the actions taken by the shellcode. According to various embodiments, the list of NOP instructions the instruction counter 822 counts at block 1004 below—and which is used to determine a non-NOP instruction for purposes of a reset condition, as described below—includes various combinations of the following: an architecturally-defined NOP instruction of the instruction set of the microprocessor 100 (e.g., an x86 architecture NOP instruction, 0x90); a branch instruction that branches to the next sequential instruction; instructions that do not modify architectural state of the microprocessor 100 other than a predetermined set of architectural state, such as one or both of the condition flags register (e.g., x86 EFLAGS) and the stack pointer register. The following x86 architecture instructions are examples: PUSH ES (0x06), PUSH CS (0x0E), PUSH SS (0x16), PUSH DS (0x1E), PUSH register (0x50-0x57), PUSH SP (0x5C), PUSHA (0x60), WAIT (0x9B), SAHF (0x9E), REPNE prefix (0xF2), CLD (0xFC), STD (0xFD), CLC (0xF8), STC (0xF9), CMC (0xF5). Additionally, in one embodiment in which the instruction set architecture of the microprocessor 100 has variable length instructions, the list of NOP instructions that may be included in the various combinations includes multi-byte NOP instructions in which each byte of the instruction taken individually is a NOP instruction. Stated alternatively, a multi-byte NOP instruction has the characteristic such that if control is transferred to any byte of the instruction, the remaining byte or bytes of the instruction still constitute a valid instruction defined by the instruction set architecture of the microprocessor 100 (e.g., will not generate an invalid instruction exception) and otherwise has the same characteristics as a single-byte NOP instruction. The following are x86 architecture examples of multi-byte NOP instructions: 2-byte CMP instructions in which the modRM byte has the value of a single-byte NOP instruction (0x38-0x3B); 2-byte CMP instructions in which the immediate byte has the value of a single-byte NOP instruction (0x3C); 3-byte CMP instructions in which the modRM byte and immediate byte have the value of a single-byte NOP instruction (0x80, 0x83); 2-byte TST instructions in which the modRM byte has the value of a single-byte NOP instruction (0x84-0x85); 2-byte TST instructions in which the immediate byte has the value of a single-byte NOP instruction (0xA8); 2-byte packed instructions in which the modRM byte has the value of a single-byte NOP instruction, e.g., PMADDWD (0xF5), PSUBB (0xF8), PSUBW (0xF9), PADDB (0xFC), PADDW (0xFD). Flow begins at block 1002.

At block 1002, the fingerprint unit 102 is loaded with a static instruction count 822 and instruction count generation criteria 838, similar to the manner described above with respect to FIGS. 8 and 9. Preferably, the static instruction count 832 is programmable by a user or system software via the fingerprint MSR 132. In one embodiment, the static instruction count 832 is programmable via fuses of the microprocessor 100. In one embodiment, the start condition is the detection of a return instruction, the reset condition is the detection of an instruction that is not a NOP instruction (a non-NOP instruction), and no stop condition is specified. Other embodiments are contemplated in which the start condition is the detection of a subroutine call instruction, a return from interrupt instruction, or a system call or return instruction, for example. Flow proceeds to block 1004.

At block 1004, while the microprocessor 100 is fetching and executing instructions, the fingerprint unit 102 counts consecutive NOP instructions based on the instruction count generation criteria 838 specified at block 1002 to generate a dynamic instruction count 824, and compares the generated dynamic instruction count 824 with the static instruction count 832 loaded at block 1002. Flow proceeds to decision block 1006.

At decision block 1006, the fingerprint unit 102 determines whether the dynamic instruction count 824 matches the static instruction count 832. If so, flow proceeds to block 1008; otherwise, flow returns to block 1004.

At block 1008, the fingerprint unit 102 indicates the match, in response to which the microprocessor 100 suspends execution of architectural instructions. Preferably, the fingerprint unit 102 causes a trap to microcode in response to detecting the match, i.e., in response to detecting a NOP slide. In one embodiment, the microcode generates an invalid opcode fault (e.g., x86 architecture INT 6). In one embodiment, the microcode generates a machine check exception (e.g., x86 architecture #MC, vector number 18). In one embodiment, if the microprocessor 100 is in a virtual machine mode (e.g., x86 VMX mode), the microcode exits the virtual machine mode. In one embodiment, if the microprocessor 100 is in a trusted execution mode, the microcode takes a security exception. Flow ends at block 1008.

Although particular embodiments of the fingerprint unit have been described and of the mathematical operation circuit, it should be understood that other embodiments may be employed to generate the dynamic fingerprints and instruction counts and to detect the matches with the static fingerprints and instruction counts.

While various embodiments of the present invention have been described herein, it should be understood that they have been presented by way of example, and not limitation. It will be apparent to persons skilled in the relevant computer arts that various changes in form and detail can be made therein without departing from the scope of the invention. For example, software can enable, for example, the function, fabrication, modeling, simulation, description and/or testing of the apparatus and methods described herein. This can be accomplished through the use of general programming languages (e.g., C, C++), hardware description languages (HDL) including Verilog HDL, VHDL, and so on, or other available programs. Such software can be disposed in any known computer usable medium such as magnetic tape, semiconductor, magnetic disk, or optical disc (e.g., CD-ROM, DVD-ROM, etc.), a network, wire line, wireless or other communications medium. Embodiments of the apparatus and method described herein may be included in a semiconductor intellectual property core, such as a microprocessor core (e.g., embodied, or specified, in a HDL) and transformed to hardware in the production of integrated circuits. Additionally, the apparatus and methods described herein may be embodied as a combination of hardware and software. Thus, the present invention should not be limited by any of the exemplary embodiments described herein, but should be defined only in accordance with the following claims and their equivalents. Specifically, the present invention may be implemented within a microprocessor device that may be used in a general-purpose computer. Finally, those skilled in the art should appreciate that they can readily use the disclosed conception and specific embodiments as a basis for designing or modifying other structures for carrying out the same purposes of the present invention without departing from the scope of the invention as defined by the appended claims.

The invention claimed is:

1. A microprocessor, comprising:
a plurality of dynamically reconfigurable functional units;
a library associating a plurality of fingerprints with a plurality of software applications, wherein each fingerprint is associated with a software application;
a fingerprint unit, wherein as the plurality of dynamically reconfigurable functional units execute instructions according to a first configuration setting, the fingerprint unit accumulates information about the instructions according to a mathematical operation to generate a result;
a device driver that determines whether a software application referenced in the library is running, and when a software application referenced in the library is running, provides the fingerprint unit with the fingerprint associated with the running software application; and
a reconfiguration unit that reconfigures the plurality of dynamically reconfigurable functional units to execute instructions according to a second configuration setting in response to an indication that the result matches the fingerprint.

2. The microprocessor of claim 1, wherein the fingerprint unit comprises a multiple input shift register (MISR) that accumulates the instruction information.

3. The microprocessor of claim 2, wherein the MISR accumulates the instruction information according to a mathematical operation that uses a maximum count polynomial.

4. The microprocessor of claim 1, wherein the fingerprint and the second configuration setting are programmable via a microcode patch.

5. The microprocessor of claim 1, wherein the instruction information comprises an instruction address and a plurality of portions of each instruction.

6. The microprocessor of claim 5, wherein the fingerprint unit is dynamically configurable to accumulate different combinations of the instruction address and the plurality of instruction portions.

7. The microprocessor of claim 1, wherein the fingerprint unit detects one or more start conditions, including a return instruction, wherein the fingerprint unit only starts to accumulate the instruction information according to the mathematical operation to generate the result when the fingerprint unit observes one of the one or more start conditions.

8. The microprocessor of claim 1, wherein the fingerprint unit detects one or more stop conditions, including a call instruction, wherein the fingerprint unit ceases to accumulate the instruction information according to the mathematical operation to generate the result when the fingerprint unit observes one of the one or more stop conditions.

9. The microprocessor of claim 8, wherein the fingerprint unit compares the result with the fingerprint when the fingerprint unit observes one of the one or more stop conditions.

10. The microprocessor of claim 1, wherein the fingerprint unit receives one or more reset conditions, wherein the fingerprint unit clears the result and again starts to accumulate the instruction information according to the mathematical operation to generate a result when the fingerprint unit observes one of the one or more reset conditions.

11. The microprocessor of claim 1, wherein the fingerprint and the second configuration setting are programmable by system software executing on the microprocessor.

12. The microprocessor of claim 1, further comprising:
a counter that counts a proxy of time, loadable in response to the indication that the result matches the fingerprint, wherein the reconfiguration unit reconfigures the plurality of dynamically reconfigurable functional units to execute instructions according to the first configuration setting in response to expiration of the counter.

13. The microprocessor of claim 1, wherein:
the fingerprint is one of a plurality of fingerprints;
the second configuration setting is one of a plurality of second configuration settings;
a plurality of second configuration settings are associated with the plurality of fingerprints;
the fingerprint unit is one of a plurality of fingerprint units;
as the plurality of dynamically reconfigurable functional units execute instructions according to the first configuration setting, each of the plurality of the fingerprint units accumulates respective information about the instructions according to a mathematical operation to generate a result; and
wherein the reconfiguration unit reconfigures the plurality of dynamically reconfigurable functional units to execute instructions according to one of the plurality of second configuration settings in response to an indication that the result of one of the plurality of fingerprint units matches an associated one of the plurality of fingerprints.

14. The microprocessor of claim 1, wherein:
the fingerprint is a first fingerprint of a plurality of fingerprints;
the plurality of fingerprints includes a second fingerprint;
the fingerprint unit is a first fingerprint unit of a plurality of fingerprint units;
the plurality of fingerprint units includes a second fingerprint unit;
as the plurality of dynamically reconfigurable functional units execute instructions according to the first configuration setting, the second fingerprint unit accumulates information about the instructions according to a mathematical operation to generate a second result; and
the first fingerprint unit begins to accumulate the information about the instructions according to the mathematical operation to generate the first result in response to an indication from the second fingerprint unit that the second result matches the second fingerprint.

15. The microprocessor of claim 1, wherein:
the fingerprint is a first fingerprint of a plurality of fingerprints;
the plurality of fingerprints includes a second fingerprint;
the fingerprint unit is operable to accumulate information about the instructions according to first and second mathematical operations to generate first and second results, respectively;
prior to accumulating the information about the instructions according to the first mathematical operation to generate the first result, the fingerprint unit accumulates information about the instructions according to the second mathematical operation to generate the second result; and
the fingerprint unit accumulates information about the instructions according to the first mathematical operation to generate the first result after the fingerprint unit detects that the second result matches the second fingerprint.

16. A method performed by a microprocessor having a plurality of dynamically reconfigurable functional units, the method comprising:
receiving a library that associates a plurality of fingerprints with a plurality of software applications, wherein each fingerprint is associated with a software application;
determining whether a software application referenced in the library is running, and when a software application referenced in the library is running, providing the fingerprint unit with the fingerprint associated with the running software application;
as the plurality of dynamically reconfigurable functional units execute instructions according to a first configuration setting, accumulating information about the instructions according to a mathematical operation to generate a result; and
reconfiguring the plurality of dynamically reconfigurable functional units to execute instructions according to a second configuration setting in response to an indication that the result matches the fingerprint.

17. The method of claim 16, wherein a multiple input shift register (MISR) performs said accumulating the instruction information.

18. The method of claim 17, wherein the MISR performs said accumulating the instruction information according to a mathematical operation that uses a maximum count polynomial.

19. The method of claim 16, wherein the instruction information comprises an instruction address and a plurality of portions of each instruction.

20. The method of claim 16, further comprising:
detecting one or more start conditions, including a return instruction, wherein the microprocessor only starts to accumulate the instruction information according to the mathematical operation to generate the result in response to observing one of the one or more start conditions.

21. The method of claim 16, further comprising:
detecting one or more stop conditions, including a call instruction, wherein the microprocessor ceases to accumulate the instruction information according to the mathematical operation to generate the result in response to observing one of the one or more stop conditions.

22. The method of claim 21, further comprising:
comparing the result with the fingerprint when one of the one or more stop conditions is observed.

23. The method of claim 16, further comprising:
receiving one or more reset conditions, wherein the microprocessor clears the result and again starts to accumulate the instruction information according to the mathematical operation to generate a result in response to observing one of the one or more reset conditions.

24. A microprocessor, comprising:
a plurality of dynamically reconfigurable functional units;
a static count;
an instruction counter, wherein as the plurality of dynamically reconfigurable functional units execute instructions according to a first selected configuration setting, the instruction counter counts the instructions that meet a first selected instruction count generation criteria to generate a dynamic count; and
a reconfiguration unit that reconfigures the plurality of dynamically reconfigurable functional units to execute instructions according to a second selected configuration setting in response to an indication that the dynamic count matches the static count;

wherein the first selected instruction count generation criteria instructs the instruction counter to count only instructions of a specified type.

25. The microprocessor of claim 24, further comprising:
a library comprising a plurality of instruction count generation criteria, a plurality of static counts, and associated configuration settings, including the first and second settings; and
a device driver that selects instruction count generation criteria, static counts, and configuration settings from the library for the reconfiguration unit to use.

26. The microprocessor of claim 24, wherein the microprocessor resets the dynamic count when detecting an instruction that does not meet the instruction count generation criteria.

27. A method performed by a microprocessor having a static count and a plurality of dynamically reconfigurable functional units, the method comprising:
as the plurality of dynamically reconfigurable functional units execute instructions according to a first selected configuration setting, counting the instructions that meet a first selected instruction count generation criteria to generate a dynamic count; and
reconfiguring the plurality of dynamically reconfigurable functional units to execute instructions according to a second selected configuration setting in response to an indication that the dynamic count matches the static count;
wherein the first selected instruction count generation criteria instructs the instruction counter to count only instructions of a specified type.

28. The method of claim 27, further comprising:
receiving a library that comprises a plurality of instruction count generation criteria, a plurality of static counts, and associated configuration settings, including the first and second settings; and
selecting instruction count generation criteria, static counts, and configuration settings from the library for the reconfiguration unit to use.

29. The method of claim 27, further comprising resetting the dynamic count when detecting an instruction that does not meet the instruction count generation criteria.

* * * * *